(12) United States Patent
Jeong et al.

(10) Patent No.: US 10,020,790 B2
(45) Date of Patent: Jul. 10, 2018

(54) COMPOSITE ELECTRONIC COMPONENT

(71) Applicant: Samsung Electro-Mechanics Co., Ltd., Suwon-si (KR)

(72) Inventors: In Wha Jeong, Suwon-si (KR); Dong Seong Oh, Suwon-si (KR); Hugh Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 155 days.

(21) Appl. No.: 14/971,659

(22) Filed: Dec. 16, 2015

(65) Prior Publication Data
US 2016/0189869 A1  Jun. 30, 2016

(30) Foreign Application Priority Data

Dec. 29, 2014 (KR) .................. 10-2014-0192579

(51) Int. Cl.
| | |
|---|---|
| *H03H 7/01* | (2006.01) |
| *H01F 27/28* | (2006.01) |
| *G05F 3/08* | (2006.01) |
| *H03H 19/00* | (2006.01) |
| *H01G 4/40* | (2006.01) |
| *H01G 4/228* | (2006.01) |
| *H01G 4/12* | (2006.01) |
| *H03H 1/00* | (2006.01) |
| *H05K 1/16* | (2006.01) |

(52) U.S. Cl.
CPC ............ *H03H 7/0115* (2013.01); *G05F 3/08* (2013.01); *H01F 27/2804* (2013.01); *H01G 4/40* (2013.01); *H03H 19/004* (2013.01); *H03H 19/008* (2013.01); *H01F 2027/2809* (2013.01); *H01G 4/12* (2013.01); *H01G 4/228* (2013.01); *H03H 2001/0085* (2013.01); *H05K 1/16* (2013.01)

(58) Field of Classification Search
CPC ......... H03H 19/004; H03H 2001/0085; H03H 19/008; H03H 7/0115
USPC ................................. 333/101, 175, 185, 262
See application file for complete search history.

(56) References Cited

U.S. PATENT DOCUMENTS

| | | | | |
|---|---|---|---|---|
| 5,336,301 | A | * | 8/1994 | Tani ........................ H01B 1/22 106/1.18 |
| 5,610,565 | A | * | 3/1997 | Maeda ................. H03H 1/0007 333/181 |

(Continued)

FOREIGN PATENT DOCUMENTS

| | | |
|---|---|---|
| CN | 201910181 U | 7/2011 |
| JP | 2535617 B2 | 9/1996 |

(Continued)

OTHER PUBLICATIONS

Korean Office Action dated May 12, 2016, in counterpart Korean Application No. 10-2014-0192579 (5 pages in English, 4 pages in Korean).

*Primary Examiner* — Rakesh Patel
(74) *Attorney, Agent, or Firm* — NSIP Law

(57) ABSTRACT

A composite electronic component includes: a power stabilization unit including a capacitor and an inductor connected to each other in series and configured to rectify input voltage to generate output voltage; and a switch unit including a first switch connected to the capacitor in parallel and a second switch connected to the inductor in parallel.

18 Claims, 5 Drawing Sheets

(56) References Cited

U.S. PATENT DOCUMENTS

| | | | |
|---|---|---|---|
| 6,437,955 B1* | 8/2002 | Duffy | H02H 3/025 361/113 |
| 2003/0030510 A1 | 2/2003 | Sasaki et al. | |
| 2007/0041222 A1 | 2/2007 | Eguchi et al. | |
| 2013/0133928 A1* | 5/2013 | Park | H05K 1/0298 174/251 |
| 2013/0181783 A1 | 7/2013 | Upadhyaya | |
| 2015/0236502 A1* | 8/2015 | Xu | H02H 3/025 361/93.9 |

FOREIGN PATENT DOCUMENTS

| | | |
|---|---|---|
| KR | 2001-0076621 A | 8/2001 |
| KR | 2003-0014586 A | 2/2003 |
| KR | 10-2006-0096468 A | 9/2006 |

\* cited by examiner

COMPOSITE ELECTRONIC COMPONENT

CROSS-REFERENCE TO RELATED APPLICATION(S)

This application claims the benefit of Korean Patent Application No. 10-2014-0192579 filed on Dec. 29, 2014 in the Korean Intellectual Property Office, the entire disclosure of which is incorporated herein by reference for all purposes.

BACKGROUND

1. Field

The following description relates to a composite electronic component including a plurality of passive elements.

2. Description of Related Art

In accordance with recent trend toward compactness, slimness and multifunctionalization of electronic devices, demands have been made for the electronic devices to be miniaturized and multifunctionalized. The electronic devices as described above may include a power semiconductor-based power management integrated circuit (PMIC) that functions to efficiently control and manage a limited battery resource in order to satisfy various service requirements.

However, as electronic devices have been multifunctionalized, the number of direct current (DC)/DC converters included in the PMIC has increased, and the number of passive elements that should be included in a power input terminal and a power output terminal of the PMIC has also increased. In this case, an area of the electronic device in which components are disposed is inevitably increased, which may limit miniaturization of the electronic device. In addition, significant noise may be generated due to wiring patterns of the PMIC and peripheral circuits of the PMIC.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a composite electronic component includes: a power stabilization unit including a capacitor and an inductor connected to each other in series and configured to rectify input voltage to generate output voltage; and a switch unit including a first switch connected to the capacitor in parallel and a second switch connected to the inductor in parallel.

The first and second switches may be configured to perform switching operations to constantly maintain a resonance frequency determined by capacitance of the capacitor and inductance of the inductor.

The first switch may be configured to perform the switching operation based on an inductance change of the inductor to change capacitance of the capacitor.

A switching period of the first switch may be determined based on an amount of inductance change of the inductor.

The second switch may be configured to perform the switching operation based on a capacitance change of the capacitor to change inductance of the inductor.

A switching period of the second switch may be determined based on an amount of capacitance change of the capacitor.

The composite electronic component may further include a terminal unit including an input terminal connected to one of the capacitor and the inductor, an output terminal connected to another one of the capacitor and the inductor, and an auxiliary terminal connected to a connection node of the inductor and the capacitor.

The first and second switches may be configured to perform switching operations to constantly maintain a resonance frequency determined by capacitance of the capacitor and inductance of the inductor.

The first switch may be configured to perform the switching operation based on an inductance change of the inductor to change capacitance of the capacitor. A switching period of the first switch may be determined based on an amount of inductance change of the inductor. The inductance change of the inductor may be measured between the input terminal and the auxiliary terminal.

The second switch may be configured to perform the switching operation based on a capacitance change of the capacitor to change inductance of the inductor. A switching period of the second switch may be determined based on a capacitance change amount of the capacitor. The capacitance change of the capacitor may be measured between the output terminal and the auxiliary terminal.

According to another general aspect, a composite electronic component includes: a composite body including a capacitor including a ceramic body that includes dielectric layers arranged in a stack and internal electrodes facing each other between the dielectric layers, an inductor including a magnetic body that includes magnetic layers, the magnetic layers being arranged in a stack and having a conductive pattern disposed thereon, and a printed circuit board disposed between the capacitor and the inductor; an input terminal disposed on a first end surface of the composite body and connected to the conductive pattern; an output terminal spaced apart from the input terminal by a predetermined distance and connected to the internal electrodes; and an auxiliary terminal disposed on a second end surface of the composite body and connected to the conductive pattern and the internal electrodes.

The inductor may be disposed above the capacitor.

The inductor and the capacitor may be connected to each other in series through the input terminal, the auxiliary terminal, and the output terminal.

The composite electronic component may include at least two switch elements mounted on circuit patterns of the printed circuit board.

The at least two switch elements may include first and second switches, the first switch being disposed between the output terminal and the auxiliary terminal, and the second switch being disposed between the input terminal and the auxiliary terminal.

The first and second switches may be configured to perform switching operations to constantly maintain a resonance frequency determined by capacitance of the capacitor and inductance of the inductor.

The internal electrodes may be disposed on middle dielectric layers among the dielectric layers.

The internal electrodes may include: a first internal electrode including a lead connected to the output terminal and exposed to the first end surface of the composite body and; and a second internal electrode including a lead connected to the auxiliary terminal and exposed to the second end surface of the composite body.

The conductive pattern may include: a first conductive pattern portion formed on one magnetic layer among the of magnetic layers, the first conductive pattern portion includ-"

ing a lead connected to the auxiliary terminal and exposed to the second end surface of the composite body; and a second conductive pattern portion formed on another magnetic layer among the magnetic layers, the second conductive pattern portion including a lead connected to the input terminal and exposed to the first end surface of the composite body.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
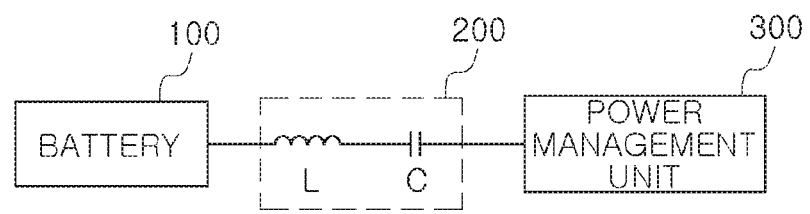
FIG. 1 is a diagram illustrating an example of a driving power supply system according to an embodiment.

FIG. 1 is a diagram illustrating an example of a driving power supply system according to an embodiment. Referring to FIG. 1, the driving power supply system includes a battery 100, a power stabilization unit 200, and power management unit 300.

The battery 100 supplies power to the power management unit 300. The power stabilization unit 200 stabilizes the power supplied from the battery 100 and supplies the stabilized power to the power management unit 300. The power stabilization unit 200 includes an inductor L and a capacitor C connected to each other in series between the battery 100 and the power management unit 300. The inductor L and the capacitor C decrease noise of the power supplied from the battery 100.

The power management unit 300 converts a voltage and a current of the power supplied through the power stabilization unit 200 and distributes, charges, and controls the power. Therefore, the power management unit 300 includes, for example, a DC/DC converter.

The power management unit 300 may include several to several tens of DC/DC converters. In order to supply sufficient current and power to the power management unit 300 including several DC/DC converters, the inductor L and the capacitor C used in the power stabilization unit 200 may be, respectively, a power inductor and a high capacitance capacitor capable of operating with a large amount of current.

The power management unit 300 is implemented, for example, as a power management integrated circuit (PMIC). The power management unit 300 changes the power supplied through the power stabilization unit 200 into driving power.

When a pattern of the driving power supply system is designed, in order to decrease a component disposition area and suppress noise from being generated, there is a need to dispose the inductor L and the capacitor C as close to the power management unit 300 as possible, and a design of wiring of a connection line is required to be short and thick.

In a case in which the number of input and output terminals of the power management unit 300 is small, there is no significant difficulty in disposing the inductor L and the capacitor C close to each other. However, in a case in which there is a need to use several output terminals of the power management unit 300, the inductor L and the capacitor C may not be normally disposed due to density of the components. In addition, the inductor L and the capacitor C may be disposed in a state in which the inductor L and the capacitor C are not optimized, and, depending on sizes of elements, the wiring of the connection line may be inevitably elongated.

Further, capacitance of the capacitor C and inductance of the inductor L of the power stabilization unit 200 may deviate from a desired setting value due to external factors such as temperature change and deviations inevitably generated in a manufacturing process. In this case, stability of the power supplied to the power management unit 300 may be outside of a design range.

Figure 2:
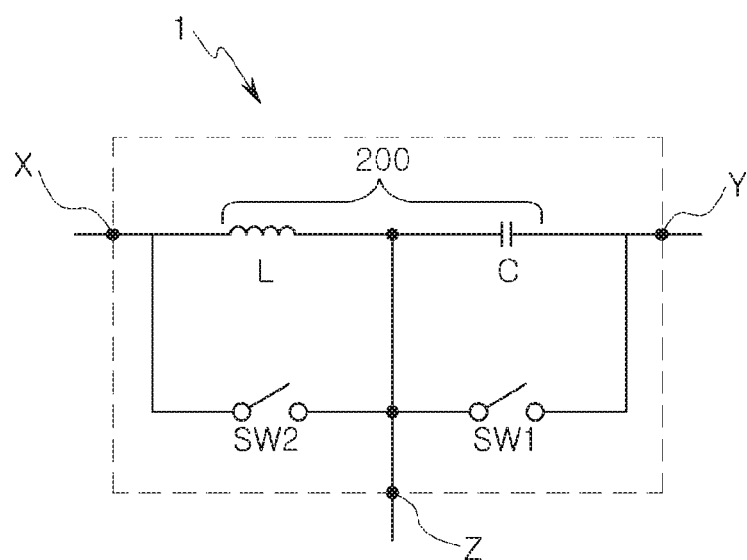
FIG. 2 is an example of a circuit diagram of a composite electronic component according to an embodiment.

FIG. 2 is a circuit diagram of a composite electronic component 1 according to an embodiment. Referring to FIG. 2, the composite electronic component 1 includes the power stabilization unit 200 including the inductor L and the capacitor C connected to each other in series.

The inductor L and the capacitor C rectify an input voltage to generate output voltage depending on a resonance frequency. The inductor L and the capacitor C stabilize the power supplied from the battery 100 (FIG. 1) to supply the stabilized power to the power management unit 300 (FIG. 1). In this case, the power stabilization unit 200 receives the power from the battery 100 through a terminal X, and outputs the stabilized power to supply the stabilized power to the power management unit 300 through a terminal Y. Further, a connection node of the inductor L and the capacitor C is connected to a terminal Z. The terminal Z may be connected to a ground or a reference voltage. In addition, the terminal Z may be floated.

The high capacitance capacitor C and the power inductor L are implemented as a single component, and thus a degree of integration of elements may be improved, and a printed circuit board (PCB) mounting area may be decreased.

The composite electronic component 1 further includes a switch unit including a first switch SW1 connected to the capacitor C in parallel and a second switch SW2 connected to the inductor L in parallel. Inductance and capacitance changes due to an external environment or the deviation inevitably generated in the manufacturing process may be compensated for by switching operations of the first switch SW1 and the second switch SW2. The resonance frequency determined by capacitance of the capacitor C and inductance of the inductor L may be constantly maintained by the switching operations of the first and second switches SW1 and SW2.

Figure 3:
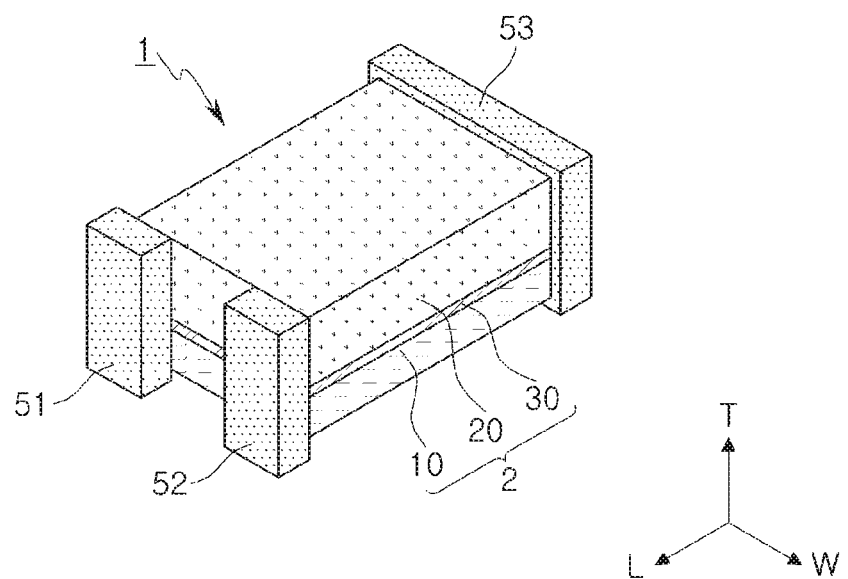
FIG. 3 is a perspective view schematically illustrating the composite electronic component according to an embodiment.
Figure 4:
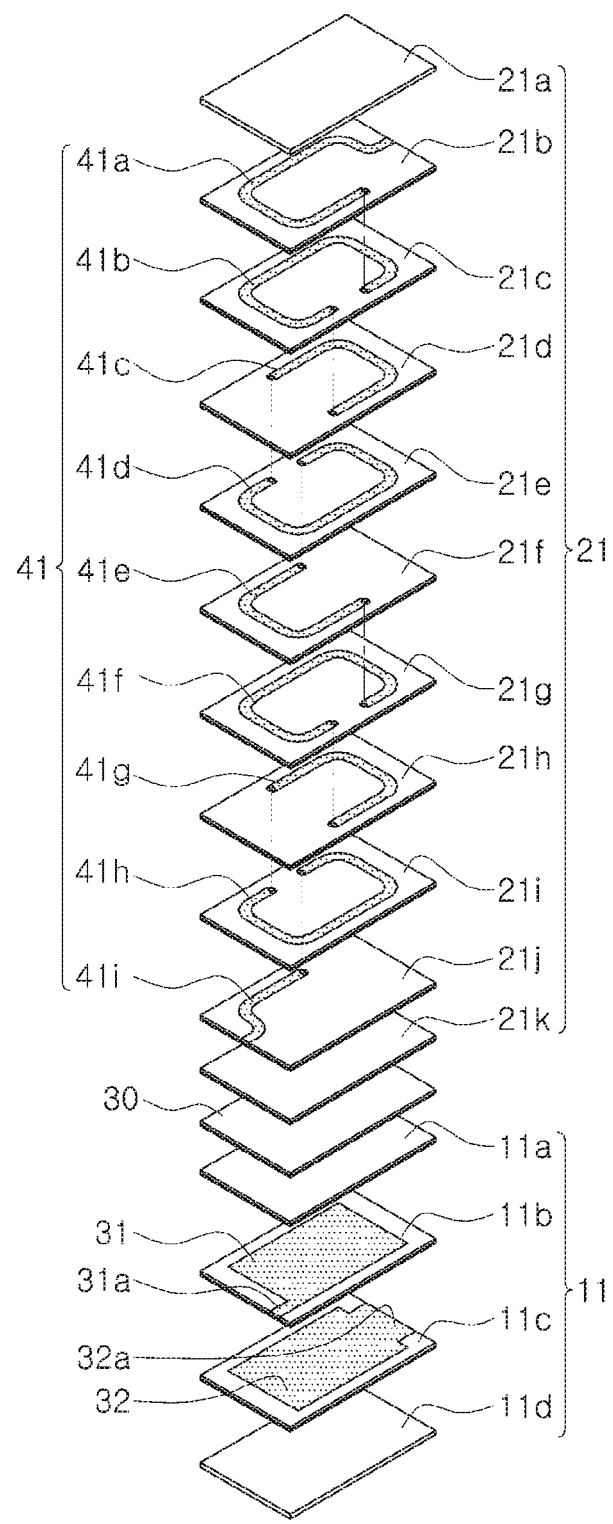
FIG. 4 is an exploded perspective view schematically illustrating an example stacking structure of the composite electronic component of FIG. 3.
Figure 5:
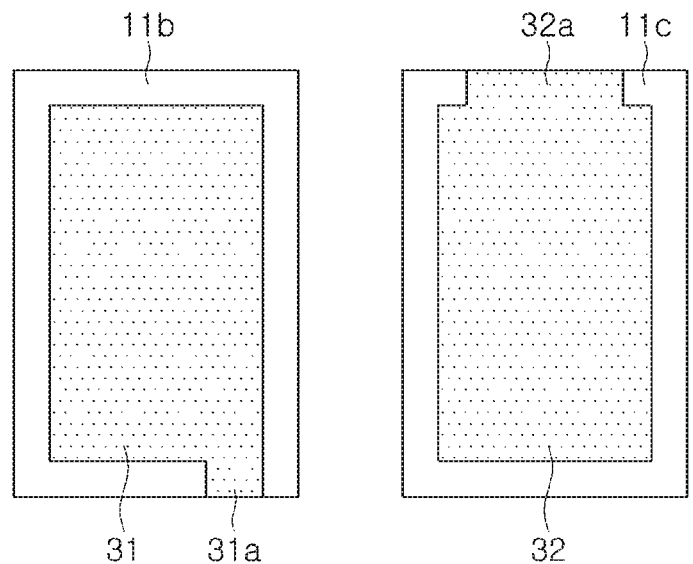
FIG. 5 is a plan view illustrating an example of internal electrodes configured to be used in a multilayer ceramic capacitor of the composite electronic component illustrated in FIG. 3.

FIG. 3 is a perspective view schematically illustrating the composite electronic component 1 according to the embodiment. In FIG. 3, directions of a hexahedron are defined in order to clearly describe the embodiment. "L," "W," and "T" illustrated in FIG. 3 refer to a length direction, a width direction, and a thickness direction, respectively. FIG. 4 is an exploded perspective view schematically illustrating a stacking structure of the composite electronic component 1. FIG. 5 is a plan view illustrating internal electrodes 31 and 32 of the composite electronic component 1.

Referring to FIGS. 3 through 5, the composite electronic component 1 includes a composite body 2 having a hexahedral shape and including a capacitor 10, an inductor 20, and a printed circuit board 30 coupled to one another.

The capacitor 10 includes a ceramic body including a plurality of dielectric layers 11 and internal electrodes 31 and 32 formed in a stack. The internal electrodes 31 and 32 are disposed on adjacent middle dielectric layers 11b and 11c among the plurality of dielectric layers 11, and the middle dielectric layers 11b and 11c are disposed between outer dielectric layers 11a and 11d among the plurality of dielectric layers 11. Although only one internal electrode 31 and one internal electrode 32 are shown, multiple internal electrodes 31 and multiple internal electrodes 32 may be provided.

The inductor 20 includes a magnetic body including a plurality of stacked magnetic layers 21 having a plurality of conductive patterns 41 disposed thereon.

The printed circuit board 30 is provided between the capacitor 10 and the inductor 20.

The composite body 2 has a hexahedral shape and includes first and second main surfaces opposing each other, and first and second lateral surfaces and first and second end surfaces that connect the first and second main surfaces to each other. The shape of the composite body 2 is not limited to a particular shape, but may be the hexahedral shape as illustrated.

The composite body 2 is formed by coupling the capacitor 10, the inductor 20, and the printed circuit board 30 to one another. For example, the composite body 2 may be formed by sequentially coupling the capacitor 10, the printed circuit board 30, and the inductor 20 which are separately manufactured using a conductive adhesive, a resin, or the like.

Hereinafter, the capacitor 10 and the inductor 20 will be described in detail.

Referring to FIG. 4, the ceramic body configuring the capacitor 10 is formed by stacking the dielectric layers 11a to 11d, and the internal electrodes 31 and 32 (sequentially first and second internal electrodes) may be separately disposed in the ceramic body on the middle dielectric layers 11b and 11c.

The plurality of dielectric layers 11 configuring the ceramic body may be in a sintered state, and adjacent dielectric layers among the plurality of dielectric layers 11 may be integrated with each other so that boundaries therebetween are not readily apparent. The plurality of dielectric layers 11 may be formed by sintering ceramic green sheets containing ceramic powder, an organic solvent, and an organic binder. The ceramic powder is a material having high permittivity, such as a barium titanate ($BaTiO_3$) based material, a strontium titanate ($SrTiO_3$) based material, or the like.

Referring to FIGS. 4 and 5, the first internal electrode 31 includes a lead 31a exposed to a first end surface of the composite body 2, and the second internal electrode 32 includes a lead 32a exposed to a second end surface of the composite body 2, opposite the first end surface.

As shown in FIG. 4, the ceramic body configuring the capacitor 10 is formed by stacking the dielectric layers 11a to 11d. The first and second internal electrodes 31 and 32 are formed on the dielectric layers 11b and 11c, respectively, and stacked.

The first and second internal electrodes 31 and 32 may be formed of a conductive paste containing a conductive metal. The conductive metal may be nickel (Ni), copper (Cu), palladium (Pd), or alloys thereof. The first and second internal electrodes 31 and 32 may be printed on the ceramic green sheets forming the dielectric layers 11b and 11c, using the conductive paste, by a printing method such as a screen printing method or a gravure printing method. The ceramic body is formed by stacking and sintering the ceramic green sheets on which the internal electrodes 31 and 32 are printed.

The magnetic body configuring the inductor 20 is formed by stacking the plurality of magnetic layers 21 on which the plurality of conductive patterns 41 is formed. More specifically, the magnetic body is formed by: printing conductive patterns 41a to 41i of the plurality of conductive patterns on magnetic green sheets 21b to 21j, respectively, of the plurality of magnetic layers 21; drying the conductive patterns 41a to 41i; stacking the magnetic green sheets 21b to 21j on which the conductive patterns 41a to 41i are formed; stacking magnetic green sheets 21a and 21k above and below, respectively, the magnetic green sheets 21b to 21j, and then sintering the stacked magnetic green sheets 21a-21k.

The plurality of magnetic layers 21 configuring the magnetic body may be in a sintered state, and adjacent magnetic layers may be integrated with each other so that boundaries therebetween are not readily apparent without a scanning electron microscope (SEM). The plurality of magnetic layers 21 may be formed of a Ni—Cu—Zn based ferrite material, a Ni—Cu—Zn—Mg based ferrite material, or a Mn—Zn based ferrite material.

The conductive patterns 41a to 41i in the magnetic body are stacked together to form a coil pattern in a stacking direction. The conductive patterns 41a to 41i may be formed by printing a conductive paste containing silver (Ag) as a main ingredient at a predetermined thickness. As shown in FIGS. 3 and 4, the conductive patterns 41a and 41i include leads electrically connected to an input terminal 51 and an auxiliary terminal 53 formed on both end portions of the composite body 2 in the length direction (an L-axis direction).

Referring to FIG. 4, the first conductive pattern 41a, having a lead exposed to the second end surface of the composite body 2, is electrically connected to the second conductive pattern 41b, with the magnetic layer 21b disposed between the first and second conductive patterns 41a and 41b, by a via electrode formed in the magnetic layer 21b. Second to eighth conductive patterns 41b to 41h are stacked in a coil shape between the first conductive pattern 41a and the ninth conductive pattern 41i having a lead exposed to the first end surface of the composite coil body 2, with each of the magnetic layers 21c-21i being disposed between adjacent conductive patterns among the conductive patterns 41b-41i. Each of the conductive patterns 41b-41i are connected to each other by a via electrode formed in each of the respective magnetic layers 21c-21i.

Although FIG. 4 shows the second conductive pattern 41b having the same configuration as the sixth conductive pattern 41f, the third conductive pattern 41c having the same configuration as the seventh conductive pattern 41g, and the fourth conductive pattern 41d having the same configuration as the eighth conductive pattern 41h, other configurations of the conductive patterns 41a-41i are possible. For example, the pattern formed by the plurality of coil patterns 41 is not limited to the pattern illustrated in FIG. 4, and although the configurations of the coil patterns 41b to 41d are repeated in the coil patterns 41f to 41h, these configurations may be repeated any number of times, or these patterns may not be repeated and each conductive pattern may have a different configuration.

Thus, the composite electronic component 1 includes the input terminal 51 formed on the first end surface of the composite body 2 and connected to the plurality of conductive patterns 41 of the inductor 20; an output terminal 52 formed on the first end surface of the composite body 2, spaced apart from the input terminal 51 and connected to the internal electrode 31 of the capacitor 10; and the auxiliary terminal 53 formed on the second end surface of the composite body 2 and connected to the plurality of conductive patterns 41 of the inductor 20 and the internal electrode 32 of the capacitor 10. The input terminal 51, the output terminal 52, and the auxiliary terminal 53 may be collectively referred to as a terminal unit.

The input terminal 51, the output terminal 52, and the auxiliary terminal 53 may be formed of a conductive paste containing a conductive metal. The conductive metal may be nickel (Ni), copper (Cu), tin (Sn), or an alloy thereof. The conductive paste may further contain an insulation material, wherein the insulation material may be, for example, glass. The input terminal 51, the output terminal 52, and the auxiliary terminal 53 may be formed by dipping the ceramic body or using another method such as a plating method.

The printed circuit board 30 is provided between the capacitor 10 and the inductor 20. A circuit pattern is provided on the printed circuit board 30, and at least one switch element is mounted on the circuit pattern. In detail, two switch elements may be mounted, a circuit pattern connected to a first switch element may be formed between the output terminal 52 and the auxiliary terminal 53, and a circuit pattern connected to a second switch element may be formed between the input terminal 51 and the auxiliary terminal 53.

Figure 6:
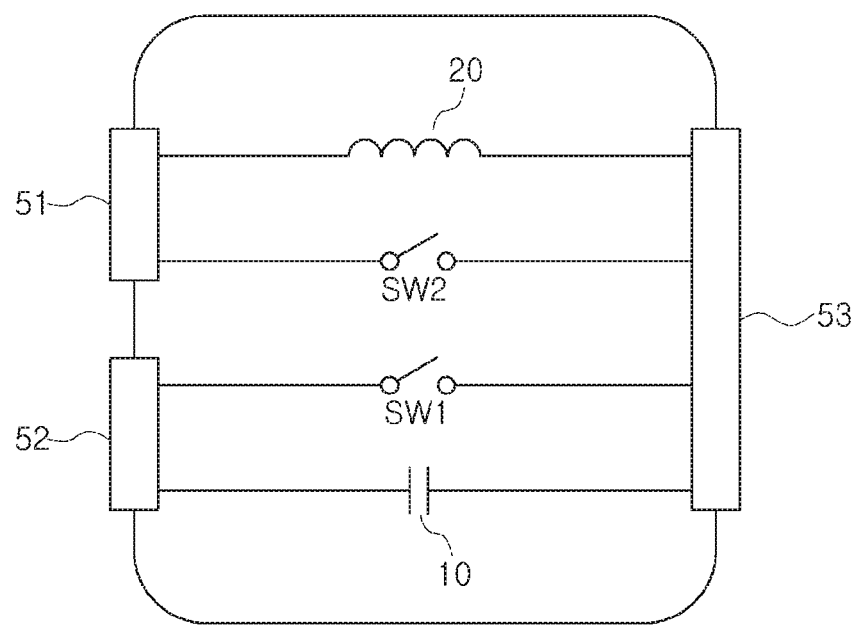
FIG. 6 is an example of an equivalent circuit diagram of the composite electronic component illustrated in FIG. 3.

FIG. 6 is an equivalent circuit diagram of the composite electronic component 1.

Referring to FIG. 6, the capacitor 10 and the inductor 20 are connected to each other in series through the input terminal 51, the auxiliary terminal 53, and the output terminal 52. Further, the first switch SW1 is disposed between the auxiliary terminal 53 and the output terminal 52 to thereby be connected to the capacitor 10 in parallel, and the second switch SW2 is disposed between the input terminal 51 and the auxiliary terminal 53 to thereby be connected to the inductor 20 in parallel.

In a case in which the first switch SW1 is switched on and the second switch SW2 is switched on, the composite electronic component 1 functions as a pure conducting wire. In a case in which the first switch SW1 is switched on and the second switch SW2 is switched off, the composite electronic component 1 functions as an inductor. In a case in which the first switch SW1 is switched off and the second switch SW2 is switched on, the composite electronic component 1 functions as a capacitor. Further, in a case in which the first switch SW1 is switched off and the second switch SW2 is switched off, the composite electronic component 1 functions as a composite module of the inductor and the capacitor connected to each other in series.

Capacitance of the capacitor 10 is determined by the following Mathematical Expression 1. In the following Mathematical Expression 1, C is capacitance of the capacitor 10, ε is permittivity of the capacitor 10, $N_C$ is the number of dielectric layers on which an internal electrode is provided, $A_C$ is an area of the internal electrode, and t is a thickness of the dielectric layer.

$$C = \varepsilon \frac{(N_C - 1) A_C}{t} \quad \text{[Mathematical Expression 1]}$$

Further, inductance of the inductor 20 is determined by the following Mathematical Expression 2. In the following Mathematical Expression 2, L is inductance of the inductor 20, μ is magnetic permeability of the inductor 20, $N_L$ is the number of magnetic layers on which a conductive pattern is provided, and $A_L$ is an area of the conductive pattern.

$$L = \mu N_L^2 A_L \quad \text{[Mathematical Expression 2]}$$

In order to compensate for a capacitance change or inductance change due to an external factor or a deviation in a manufacturing process with inductance or capacitance, a design condition as in the following Mathematical Expression 3 is employed. According to the following Mathematical Expression 3, the composite electronic component may always have a constant resonance frequency in spite of external factors or deviations in the manufacturing process, and thus the composite electronic component may be effectively applied to various modules requiring a stable resonance circuit.

$$\varepsilon A_C = \frac{1}{\mu A_L} \quad \text{[Mathematical Expression 3]}$$

The resonance frequency determined by capacitance of the capacitor C and inductance of the inductor L may be constantly maintained by the switching operations of the first and second switches SW1 and SW2.

In this case, the first switch SW1 performs the switching operation depending on the inductance change of the inductor 20 to change capacitance of the capacitor 10. A switching period of the first switch SW1 is determined depending on an amount of inductance change of the inductor 20. The inductance change of the inductor L is measured between the input terminal 51 and the auxiliary terminal 53.

Similarly, the second switch SW2 performs the switching operation depending on the capacitance change of the capacitor 10 to change inductance of the inductor 20. A switching period of the second switch SW2 is determined depending on a capacitance change amount of the capacitor 10. The capacitance change of the capacitor 10 is measured between the output terminal 52 and the auxiliary terminal 53.

For example, a method of compensating for the capacitance change by changing inductance of the inductor 20 in a case in which capacitance of the capacitor 10 is changed by an external factor such as temperature change will be described. The capacitance change of the capacitor 10 is measured by detecting current measured in the output terminal 52 and the auxiliary terminal 53.

In a case in which capacitance of the capacitor 10 is increased, a resonance frequency fr is decreased according to the following Mathematical Expression 4, and thus in order to compensate for the decreased resonance frequency fr, there is a need to decrease inductance of the inductor 20.

To this end, the second switch SW2 connected to the inductor 20 in parallel performs the switching operation in order to decrease inductance of the inductor 20, and thus equivalent inductance of the inductor 20 is changed by the switching operation of the second switch SW2. In this case, the second switch SW2 periodically performs the switching operation.

$$fr = \frac{1}{2\pi\sqrt{LC}}$$ [Mathematical Expression 4]

Figure 7:
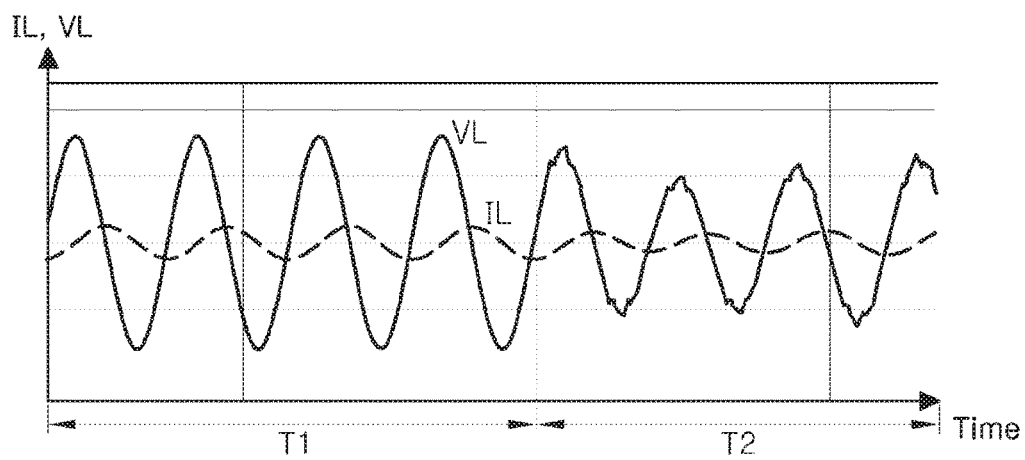
FIG. 7 is a graph illustrating inductance change depending on a switching operation of the composite electronic component, according to an example.

FIG. 7 is a graph for describing inductance change depending on a switching operation.

In FIG. 7, the second switch SW2 connected to the inductor 20 in parallel does not perform the switching operation in a T1 section but performs the switching operation in a T2 section, within a predetermined period. Comparing the T1 section and the T2 section to each other, it can be confirmed that an inductor current IL and an inductor voltage VL were decreased in the T2 section as compared to the T1 section. The inductor voltage VL and the inductor current IL in each of the sections may be measured at both ends of the input terminal 51 and the auxiliary terminal 53.

An inductance change amount ΔL in the T1 and T2 sections depending on the switching operation is determined by a change amount ΔVL of the inductor voltage and a change rate (=dIL/dt) of the inductance current IL as in the following Mathematical Expression 5.

$$\Delta L \approx \frac{\Delta VL}{\left(\frac{dIL}{dt}\right)}$$ [Mathematical Expression 5]

According to Mathematical Expression 5, the inductance change amount ΔL is determined by changes in the inductor voltage VL and the inductor current IL, and the resonance frequency may be constantly maintained by compensating for the capacitance change amount with the inductance change amount ΔL.

In the composite electronic component 1 disclosed herein, the capacitor 10 and the inductor 20 are coupled to each other, and thus the capacitor 10 and the inductor 20 are designed to have a shortest distance therebetween, thereby decreasing noise.

The capacitor 10 and the inductor 20 are coupled to each other, and thus a mounting area in the power management IC (PMIC) may be significantly decreased, thereby securing a mounting space and decreasing costs when the capacitor 10 and the inductor 20 are mounted.

Further, the constant resonance frequency may be maintained by compensating for the capacitance change of the capacitor 10 and the inductance of change of the inductor 20 depending on the switching operations of the switch SW2 connected to the inductor 20 in parallel and the switch SW1 connected to the capacitor 10 in parallel.

As set forth above, with the composite electronic component according to embodiments disclosed herein, a component mounting area may be reduced, generation of noise may be suppressed, and a resonance frequency may be constantly maintained in the driving power supply system.

The apparatuses, units, modules, devices, and other components (e.g., the management unit 300) described herein with respect to FIG. 1 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composite electronic component comprising:
   a power stabilization unit comprising a capacitor and an inductor connected to each other in series and configured to rectify input voltage to generate output voltage; and
   a switch unit comprising
      a first switch connected to the capacitor in parallel, and comprising a first connection node connected between the capacitor and the inductor, and
      a second switch connected to the inductor in parallel, and comprising a second connection node connected between the capacitor and the inductor.

2. The composite electronic component of claim 1, wherein the first and second switches are configured to perform switching operations to constantly maintain a resonance frequency determined by a capacitance of the capacitor and an inductance of the inductor.

3. The composite electronic component of claim 2, wherein the first switch is configured to perform the switching operation based on an inductance change of the inductor to change the capacitance of the capacitor.

4. The composite electronic component of claim 3, wherein a switching period of the first switch is determined based on an amount of the inductance change of the inductor.

5. The composite electronic component of claim 2, wherein the second switch is configured to perform the switching operation based on a capacitance change of the capacitor to change the inductance of the inductor.

6. The composite electronic component of claim 5, wherein a switching period of the second switch is determined based on an amount of the capacitance change of the capacitor.

7. The composite electronic component of claim 1, further comprising a terminal unit comprising an input terminal connected to one of the capacitor and the inductor, an output terminal connected to another one of the capacitor and the inductor, and an auxiliary terminal connected to the first connection node and the second connection node.

8. The composite electronic component of claim 7, wherein the first and second switches are configured to perform switching operations to constantly maintain a resonance frequency determined by a capacitance of the capacitor and an inductance of the inductor.

9. The composite electronic component of claim 8, wherein:
the first switch is configured to perform the switching operation based on an inductance change of the inductor to change the capacitance of the capacitor;
a switching period of the first switch is determined based on an amount of the inductance change of the inductor; and
the inductance change of the inductor is measured between the input terminal and the auxiliary terminal.

10. The composite electronic component of claim 8, wherein:
the second switch is configured to perform the switching operation based on a capacitance change of the capacitor to change the inductance of the inductor;
a switching period of the second switch is determined based on an amount of the capacitance change of the capacitor; and
the capacitance change of the capacitor is measured between the output terminal and the auxiliary terminal.

11. A composite electronic component comprising:
a composite body comprising
a capacitor comprising a ceramic body that comprises dielectric layers arranged in a stack and internal electrodes facing each other between the dielectric layers,
an inductor comprising a magnetic body that comprises magnetic layers, the magnetic layers being arranged in a stack and having a conductive pattern disposed thereon, and
a printed circuit board disposed between the capacitor and the inductor;
an input terminal disposed on a first end surface of the composite body and connected to the conductive pattern;
an output terminal spaced apart from the input terminal by a predetermined distance and connected to the internal electrodes;
an auxiliary terminal disposed on a second end surface of the composite body and connected to the conductive pattern and the internal electrodes; and
at least two switch elements mounted on circuit patterns of the printed circuit board.

12. The composite electronic component of claim 11, wherein the inductor is disposed above the capacitor.

13. The composite electronic component of claim 11, wherein the inductor and the capacitor are connected to each other in series through the input terminal, the auxiliary terminal, and the output terminal.

14. The composite electronic component of claim 11, wherein the conductive pattern comprises:
a first conductive pattern portion formed on one magnetic layer among the magnetic layers, the first conductive pattern portion comprising a lead connected to the auxiliary terminal and exposed to the second end surface of the composite body; and
a second conductive pattern portion formed on another magnetic layer among the magnetic layers, the second conductive pattern portion comprising a lead connected to the input terminal and exposed to the first end surface of the composite body.

15. The composite electronic component of claim 11, wherein the at least two switch elements comprise first and second switches, the first switch being disposed between the output terminal and the auxiliary terminal, and the second switch being disposed between the input terminal and the auxiliary terminal.

16. The composite electronic component of claim 15, wherein the first and second switches are configured to perform switching operations to constantly maintain a resonance frequency determined by a capacitance of the capacitor and an inductance of the inductor.

17. The composite electronic component of claim 11, wherein the internal electrodes are disposed on middle dielectric layers among the dielectric layers.

18. The electronic component of claim 11, wherein the internal electrodes comprise:
a first internal electrode comprising a lead connected to the output terminal and exposed to the first end surface of the composite body; and
a second internal electrode comprising a lead connected to the auxiliary terminal and exposed to the second end surface of the composite body.

\* \* \* \* \*